United States Patent

[11] 3,586,987

[72] Inventor David J. Fullagar
Los Altos, Calif.
[21] Appl. No. 815,042
[22] Filed Apr. 10, 1969
[45] Patented June 22, 1971
[73] Assignee Fairchild Camera and Instrument
Sydsset, Long Island, N.Y.

[54] TRANSISTOR BIAS CIRCUIT
4 Claims, 2 Drawing Figs.

[52] U.S. Cl. 330/22, 307/296, 330/38 M, 330/40
[51] Int. Cl. H03f 3/04
[50] Field of Search 330/22, 38, 38 M, 40; 307/296, 303

[56] References Cited

UNITED STATES PATENTS

| | | | |
|---|---|---|---|
| 3,500,220 | 3/1970 | Buckley | 330/38 X |
| 3,500,224 | 3/1970 | Greeson | 330/38 X |

*Primary Examiner*—Roy Lake
*Assistant Examiner*—James B. Mullins
*Attorneys*—Roger S. Borovoy and Alan H. MacPherson

ABSTRACT: A circuit for biasing transistors particularly suited for monolithic circuits utilizes a pair of NPN-PNP input transistors operating in conjunction with a constant-current source. The biasing circuit enables the input bias current to be substantially independent of the current gain of the PNP transistors.

DAVID FULLAGAR
INVENTOR

BY Stuart Lubitz
Roger L. Borovoy
ATTORNEY

TRANSISTOR BIAS CIRCUIT

BACKGROUND OF THE INVENTION

1. Field of the Invention

The invention relates to a biasing circuit for transistors and integrated circuits.

2. Description of the Prior Art

Over the past few years, the use of monolithic and other types of integrated circuits has greatly increased. Design problems peculiar to these circuits have arisen since some of the desirable characteristics of discrete components are not readily attainable in monolithic circuits. In the case of input circuits to certain solid-state amplifiers, such as operational amplifiers, it is desirable to maintain the input bias current at as low a level as possible. This can be achieved using high beta NPN transistors. However, integrated NPN transistors have relatively poor $Bv_{EBO}$ (breakdown voltage from emitter to base). This presents a problem where a differential emitter-coupled pair is to be used at the input of a circuit such as an operational amplifier or a comparator, since large input signals will destroy the transistors.

Monolithic PNP transistors can be used in this application since they have relatively higher values of $BV_{EBO}$. Unfortunately, however, PNP transistors have relatively low betas, and require undesirable high input bias currents.

One prior art solution to these problems in the case of a monolithic input circuit utilizing two inputs (e.g., an inverted and a noninverted input) has been to utilize a composite PNP transistor pair, employing two emitter-follower connected NPN's driving a pair of common-base PNP's. The base electrodes of the NPN transistors are utilized to receive the input signals. The emitters of these NPN transistors are coupled to the emitters of the PNP transistors, which are coupled in a common based configuration. A constant current source is coupled to the bases of the PNP transistors to maintain stability of the circuit. The NPN-PNP combination has the high current gain character of an NPN pair with the added advantage that the effect of the collector-base capacitance is reduced. The breakdown between inputs is high, since this is determined by the $BV_{EBO}$ of the PNP transistors.

This circuit has the disadvantage that the collector current in the NPN transistors is directly dependent on the current gain of the PNP transistors. Since it is difficult in the manufacturing of a monolithic circuit to produce a PNP transistor with a constant and repeatable current gain, the input bias current for the circuit varies significantly from circuit to circuit. This is an undesirable characteristic of the NPN-PNP transistor pair when used in an input circuit. The bias circuit of the invention eliminates the above problem by substantially reducing the dependency of the input bias current on the current gain of the PNP transistors.

SUMMARY OF THE INVENTION

The circuit of the invention which is particularly suitable for use in an input stage utilizing a pair of NPN-PNP transistors, consists of first and second PNP transistors. Both of these transistors are coupled to a common source of voltage through their emitter electrodes. The base and collector electrodes of the first transistor and the base electrode of the second transistor are coupled together to the collectors of the input NPN transistors. A constant current source is coupled to the collector electrode of the second transistor and to the base electrodes of the input PNP transistors. Normally, the input bias current to the input NPN transistors is a function of the current gain of the input PNP transistors. When the input pair is biased with the first and second PNP transistors the input bias current is substantially independent of the current gain of the input PNP transistors.

DETAILED DESCRIPTION OF THE INVENTION

Figure 1:
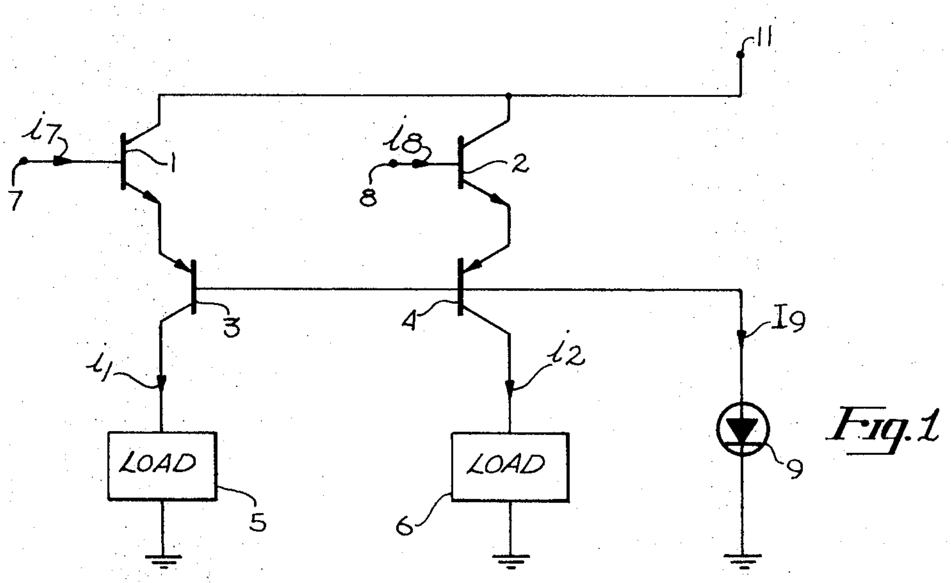
Fig.1 PRIOR ART
FIG. 1 is a circuit diagram of a prior art input stage.

In FIG. 1, a typical prior art input stage utilizing a pair of NPN-PNP transistors is illustrated. The input signals for the stage are received on terminals 7 and 8. Often one terminal receives a noninverted input signal while the other terminal receives an inverted input signal. The collector electrodes of the input NPN transistors 1 and 2 are coupled to a common voltage source 11 which is preferably a constant voltage source. The emitter electrodes of 1 and 2 are coupled to the emitter electrodes of a pair of PNP transistors 3 and 4. The base electrodes of 3 and 4 are coupled to a constant current source 9. The emitter electrodes of 3 and 4 are each coupled to loads 5 and 6, respectively. Loads 5 and 6 may be a passive device (e.g., resistor) or an active device (e.g., transistor).

This circuit is commonly utilized as an input stage to an integrated circuit since it has several desirable characteristics. With present integrated circuit technology, it is generally difficult to produce PNP transistors which have consistently high current gains. The pair of NPN-PNP transistors 1, 3 and 2, 4 shown in FIG. 1 solve this problem. The NPN-PNP transistors 1, 3 and 2, 4 act as a common-emitter PNP transistor having a high current gain while also providing a lower collector-to-base capacitance than is achieved with other circuits. Thus, the input bias current to transistors 1 and 2, $i_7$ and $i_8$, respectively, may be relatively small since the NPN-PNP pair of transistors has similar characteristics to a high gain transistor. It is, of course, desirable to keep the input bias current of any stage as low as possible.

Another difficulty with monolithic PNP transistors is their relatively low reverse-bias breakdown voltage between emitter and base ($BV_{EBO}$). In the situation where one input to one input stage is to be inverted, a high $BV_{EBO}$ is required. The NPN-PNP pair shown in FIG. 1 provides a high $BV_{EBO}$, thus overcoming this difficulty.

The circuit of FIG. 1 has a severe disadvantage. The input bias currents $i_7$and $i_8$are substantially dependent upon the current gain of transistors 3 and 4 assuming $I_9$ is constant. In monolithic circuit manufacturing, it is difficult to produce PNP transistors with constant and repeatable current gain factors. Thus, Currents $i_7$ and $i_8$ can vary considerably from circuit to circuit, even where the fabrication techniques are closely controlled.

By way of example, table I illustrates the variation in input bias current as a function of the current gain, $\beta$, of transistors 1 and 2. In table I it is assumed that $I_9$ is equal to 26 microamperes and that the current gain of the NPN transistors, 1 and 2, is equal to 100. The currents $i_1$, $i_2$, $i_7$ and $i_8$ are shown first for a current gain of four for transistors 3 and 4, and secondly for a current gain of 100 for transistors 3 and 4. The values in table I are computed for the conditions when the currents through transistors 1 and 2 are equal. The table is constructed utilizing the relationship that the current gain, $\beta$, is equal to the ratio of the collector current over the base current and other well known circuit principles.

TABLE I $I_1=26$ μa.
$\beta_1=\beta_2=100$

| | $\beta_3=\beta_4=4$ | $\beta_3=\beta_4=100$ |
|---|---|---|
| $i_1$ | 52 μa. | 1.3 ma. |
| $i_2$ | 52 μa. | 1.3 ma. |
| $i_7$ | 645 na. | 12.9 μa. |
| $i_8$ | 645 na. | 12.9 μa. |

When the current gain of transistors 3 and 4 is equal to 4, the collector current of transistors 3 and 4 is equal to 52 microamperes. For this condition, each input bias current $i_7$ and $i_8$ is equal to 645 microamperes. Next, assuming that the current gain of transistors 3 and 4 is equal to 100, the collector current of transistors 3 and 4 is equal to 1.3 milliamperes. To maintain the 1.3-milliampere condition, each input bias current $i_7$ and $i_8$ must be 12.9 microamperes. Thus, for variations of current gain from 4 to 100, the input bias current has changed by a factor of approximately 20. This wide variation in input bias current is undesirable, and is prevented by the improved circuit of the invention.

Figure 2:
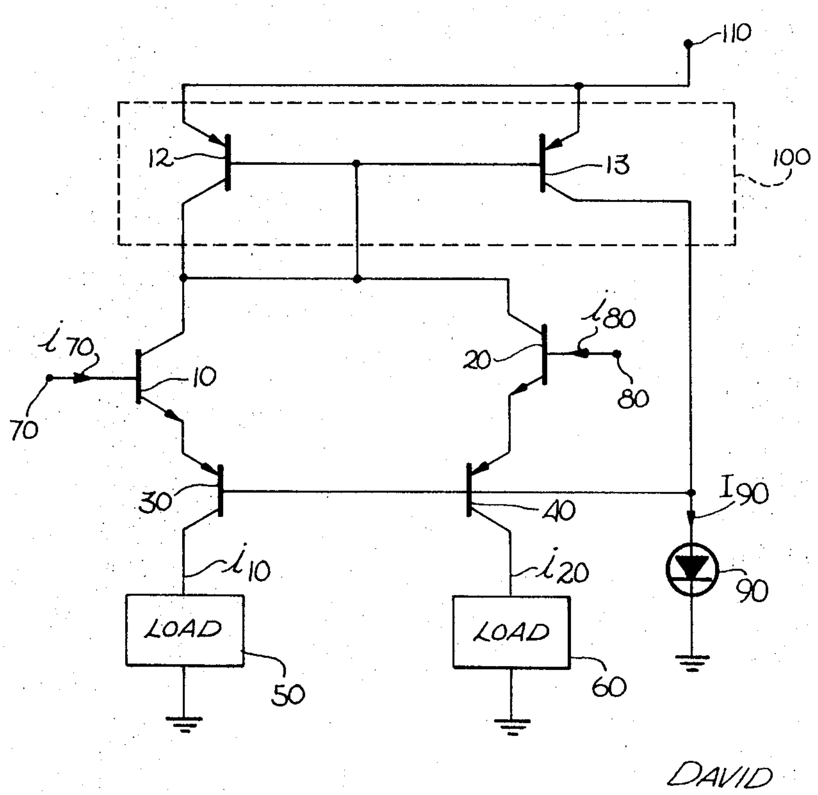
FIG. 2 is a circuit diagram for an input stage containing an embodiment of the circuit of the invention.

One embodiment of the improved circuit disclosed herein is shown in FIG. 2 with the main circuit changes within dotted line 100. The circuit 100 consists of PNP transistor 12 and PNP transistor 13. The emitter electrodes of transistors 12 and 13 are coupled to a common voltage source 110 preferably comprising a constant voltage source. The base electrodes of transistors 12 and 13 are coupled to the collector electrode of 12. This common junction is then coupled to the collector electrodes of transistors 10 and 20. The collector electrode of transistor 13 is coupled to constant current source 90.

The remainder of the circuit shown in FIG. 2 is similar to the circuit shown in FIG. 1. The transistors 10 and 20 are the input NPN transistors. The terminal 70 coupled to the base electrode of transistor 10 is provided to receive input signals to the circuit. The input bias current for transistor 10 is $i_{70}$. Similarly, transistor 20, an NPN transistor, receives input signals on terminal 80 and its input bias current is $i_{80}$. The emitter electrodes of transistors 10 and 20 are coupled to the emitter electrodes of PNP transistors 30 and 40, respectively. The base electrodes of transistors 30 and 40 are coupled to constant current source 90 and the collector electrode of transistor 13. The collector electrodes of transistors 30 and 40 are coupled to loads 50 and 60, respectively. As in the case of the circuit shown in FIG. 1, loads 50 and 60 may be resistors, solid state devices such as transistors, or any other circuit element which may act as a load for transistors 30 and 40. The input characteristics of the disclosed circuit are the same as those discussed for the circuit shown in FIG. 1 except importantly, the input bias current $i_{70}$ and $i_{80}$ are substantially independent of the current gain, $\beta$, of the NPN transistors.

The functioning of the disclosed bias circuit can best be explained by way of example. Table II illustrates the variation in the input bias current for two conditions. The first condition occurs when the current gain, $\beta$, of the PNP transistors is equal to 4, and the second condition occurs when the current gain of the PNP transistors is equal to infinity. The parameters are similar to those used in table I, that is, the constant current source 90 is equal to 26 microamperes and the current gain of the NPN transistors 10 and 20 is equal to 100. In addition, as in the case for table I, the computation of the values of $i_{10}$, $i_{20}$, $i_{70}$ and $i_{80}$ is performed utilizing well-known circuit principles.

TABLE II $I_9=26$ μa.
$\beta_{10}=\beta_{20}=100$

| | $\beta_{30}=\beta_{40}=4$ $\beta_{12}=\beta_{13}=4$ | $\beta_{30}=\beta_{40}=\infty$ $\beta_{12}=\beta_{13}=\infty$ |
|---|---|---|
| $i_{10}$ | 12 μa. | 13 μa. |
| $i_{20}$ | 12 μa. | 13 μa. |
| $i_{70}$ | 15 na. | 13 na. |
| $i_{80}$ | 15 na. | 13 na. |

For the first condition, when the current gain of the PNP transistors, 12, 13, 30 and 40, is equal to 4, the collector current for transistors 30 and 40 is equal to 12 milliamperes. To maintain this collector current, each input bias current, $i_{70}$ and $i_{80}$, must be 15 nanoamperes.

For the second condition, when the current gain, $\beta$, of the PNP transistors 12, 13, 30 and 40 is equal to infinity, the collector current for transistors 30 and 40, $i_{10}$ and $i_{20}$ is equal to 13 milliamperes. In order to maintain this collector current, each input bias current must be equal to 13 nanoamperes. Thus, for variation of the current gain for the PNP transistors from 4 to infinity, the input bias current has changed by less than 15 percent. Note that in the prior art circuit shown in FIG. 1, for a change in the current gain of the PNP transistors from 4 to 100, the input bias current has changed by a factor of 20. Therefore, by utilizing the disclosed bias circuit, the input bias current is substantially independent of the current gain of the PNP transistors.

Although the circuit illustrated in FIG. 2 is shown with the emitter electrodes of transistors 12 and 13 coupled to the constant voltage supply, the collector electrode of these transistors may be interchanged with their respective emitter electrodes and approximately the same performance could be achieved.

Although this invention has been disclosed and illustrated with reference to particular applications, the principles involved are susceptible of numerous other applications which may be apparent to persons skilled in the art. The invention is, therefore, to be limited only as indicated by the scope of the appended claims.

I claim:

1. A circuit for biasing a network comprising:
a first transistor having at least a base, emitter and collector electrodes, said base electrode coupled to said collector electrode;
a second transistor having at least a base, collector and emitter electrodes, said base electrode coupled to the base electrode of said first transistor to form a common base connection, said emitter electrode coupled to the emitter electrode of said first transistor; a source of constant current coupled to the collector electrode of said second transistor;
a set of transistor pairs comprising an NPN transistor and a PNP transistor, with the emitter electrode of one transistor in a pair coupled to the emitter electrode of the other transistor, said NPN transistor of each pair having a collector electrode coupled to the common-base connection of said first and second transistors, said PNP transistors having a base electrode coupled to the source of constant current; so that when a source of direct current potential is coupled to the emitter electrodes of said first and second transistors, a biasing source is provided for said set of transistor pairs.

2. In an amplifier input stage comprising:
a first and second transistor each having at least a collector, a base and an emitter electrode, each of said base electrode suitable for receiving an input signal;
third and fourth transistors each having an emitter, a base and a collector electrode, the base electrode of said third transistor coupled to the base electrode of said fourth transistor to form a common-base connection;
said emitter electrode of said first transistor coupled to the emitter electrode of said third transistor and the emitter electrode of said second transistor coupled to the emitter electrode of said fourth transistor;
said collector electrodes of said third and fourth transistors each coupled to a load, said common-base connection coupled to a source of constant current; and
a biasing circuit for providing a potential for the input stage comprising:
a fifth transistor having at least an emitter, a base and a collector electrode, said emitter electrode coupled to a source of direct-current potential, said base electrode coupled to said collector electrode, said collector electrode coupled to the collector electrodes of said first and second transistors; and
a sixth transistor having at least an emitter, a base and a collector electrode, said emitter electrode coupled to said source of direct-current potential, said base electrode coupled to the base electrode of said fifth transistor, said collector electrode coupled to said source of constant current.

3. The circuit defined in claim 2 wherein said first and second transistors of said input stage are NPN transistors and said third and fourth transistors of said input stage are PNP transistors.

4. The circuit defined in claim 3 wherein said fifth and sixth transistors comprising said biasing circuit are PNP transistors.